United States Patent
Lin

(10) Patent No.: US 10,274,268 B2
(45) Date of Patent: Apr. 30, 2019

(54) THERMAL ISOLATED PLATFORM SYSTEM AND METHOD

(71) Applicant: Timecubic, Inc., Woburn, MA (US)

(72) Inventor: Mu-Hong Lin, Danvers, MA (US)

(*) Notice: Subject to any disclaimer, the term of this patent is extended or adjusted under 35 U.S.C. 154(b) by 329 days.

(21) Appl. No.: 15/419,961

(22) Filed: Jan. 30, 2017

(65) Prior Publication Data

US 2017/0219301 A1 Aug. 3, 2017

Related U.S. Application Data

(60) Provisional application No. 62/288,346, filed on Jan. 28, 2016.

(51) Int. Cl.
| | |
|---|---|
| *H02N 2/00* | (2006.01) |
| *H03L 1/04* | (2006.01) |
| *B23P 19/00* | (2006.01) |
| *F28F 13/00* | (2006.01) |

(52) U.S. Cl.
CPC ............ *F28F 13/00* (2013.01); *B23P 19/00* (2013.01); *H02N 2/00* (2013.01); *H03L 1/04* (2013.01); *F28F 2270/00* (2013.01)

(58) Field of Classification Search
CPC ....... F28F 13/00; F28F 2270/00; B23P 19/00; H02N 2/00; H03L 1/04
USPC .......... 310/344, 345, 351, 348; 118/50, 668; 331/94.1, 3
See application file for complete search history.

(56) References Cited

U.S. PATENT DOCUMENTS

| | | | |
|---|---|---|---|
| 4,454,440 A * | 6/1984 | Cullen | G01L 9/0025 310/313 B |
| 6,236,145 B1 | 5/2001 | Biernacki | |
| 6,731,180 B1 * | 5/2004 | Clark | H03B 5/326 310/341 |
| 7,215,213 B2 | 5/2007 | Mescher et al. | |
| 8,410,868 B2 | 4/2013 | Schoepf et al. | |
| 8,456,249 B2 | 6/2013 | DeNatale et al. | |
| 8,937,513 B2 | 1/2015 | DeNatale et al. | |
| 2004/0021402 A1* | 2/2004 | Morley | H03H 9/0514 310/348 |
| 2015/0168445 A1* | 6/2015 | Kley | G01N 23/225 118/668 |

* cited by examiner

*Primary Examiner* — Arnold M Kinkead
(74) *Attorney, Agent, or Firm* — John A. Arsenault; Daniel M. Dubuisson

(57) ABSTRACT

The present invention provides an apparatus and method for supporting a mechanically stable and thermally isolated platform for operating sample devices which require extensive thermal isolation. The apparatus comprises a mounting base, a substrate, and microstructured tubes interconnecting the mounting base and substrate and having a thermally resistive inner portion and a thin coated layer that exhibits high electrical conductivity and low thermal emissivity. Radiation reflectors may be incorporated into the apparatus to protect components and reflect infrared radiation, and a getter equipped vacuum cover may be sealed to a vacuum header to maintain a low pressure environment within the apparatus.

20 Claims, 3 Drawing Sheets

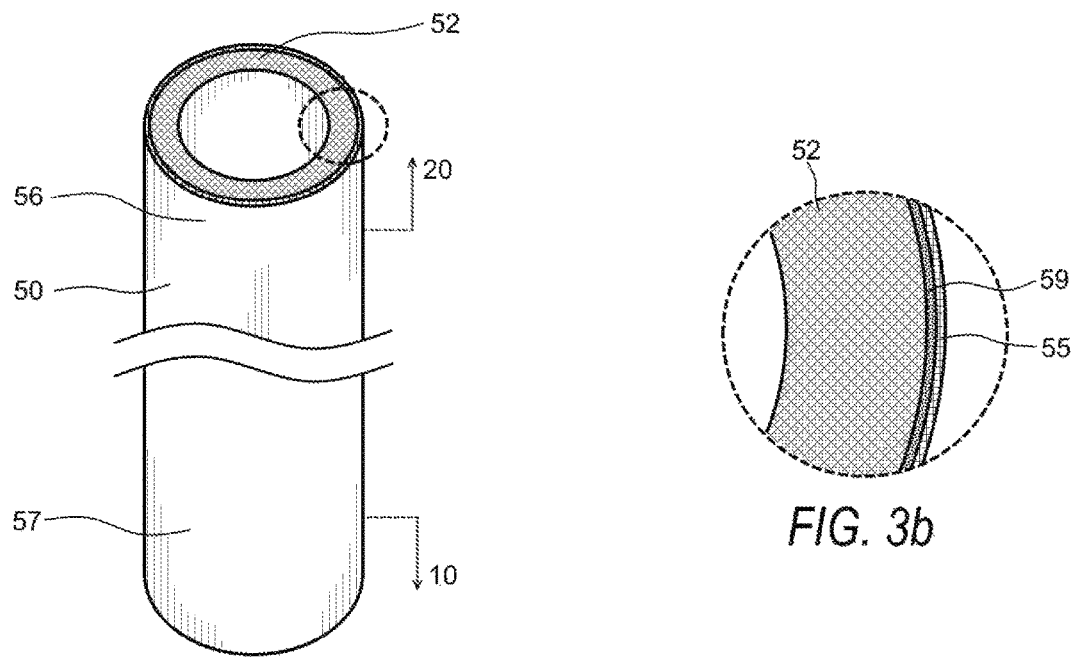
FIG. 3a
FIG. 3b
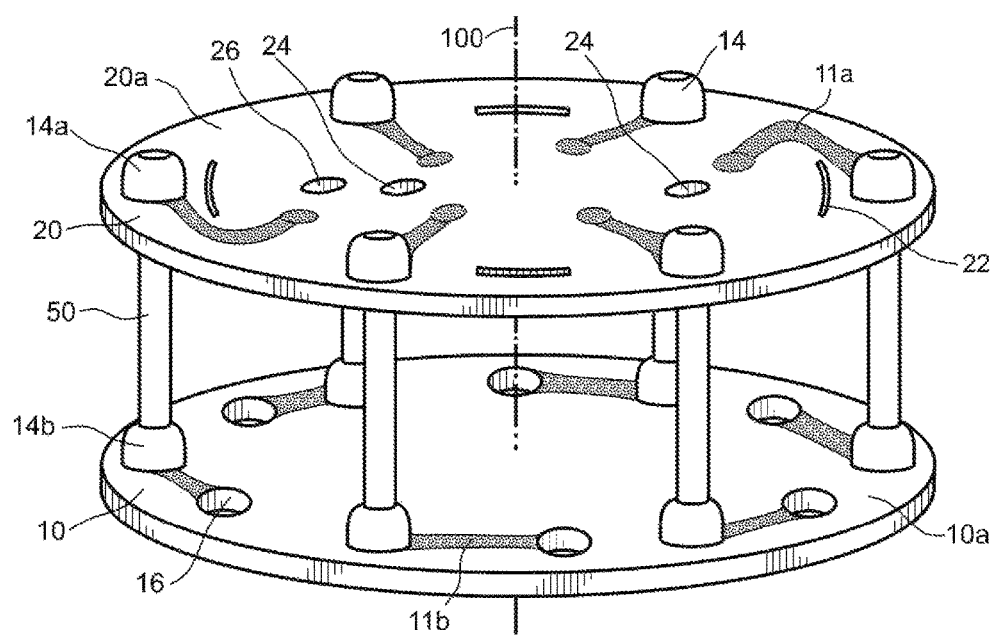
FIG. 4

THERMAL ISOLATED PLATFORM SYSTEM AND METHOD

STATEMENT REGARDING FEDERALLY SPONSORED RESEARCH AND DEVELOPMENT

Not Applicable.

CROSS-REFERENCE TO RELATED APPLICATIONS

This application is related to and/or claims the benefit of the earliest available effective filing date(s) from the following listed application(s) (the "Priority Applications"), if any, listed below (e.g., claims earliest available priority dates for other than provisional patent applications or claims benefits under 35 USC § 119(e) for provisional patent applications, for any and all parent, grandparent, great-grandparent, etc. applications of the Priority Application(s)). In addition, the present application is related to the "Related Applications," if any, listed below.

PRIORITY APPLICATIONS

U.S. Provisional Patent Application No. 62/288,346 titled "Thermal Isolated Platform System and Method," filed on Jan. 28, 2016, the subject matter of which is incorporated by reference herein in its entirety.

If the listings of applications provided above are inconsistent with the listings provided via an ADS, it is the intent of the Applicant to claim priority to each application that appears in the Priority Applications section of the ADS and to each application that appears in the Priority Applications section of this application.

All subject matter of the Priority Applications and the Related Applications and of any and all parent, grandparent, great-grandparent, etc. applications of the Priority Applications and the Related Applications, including any priority claims, is incorporated herein by reference to the extent such subject matter is not inconsistent herewith.

If an Application Data Sheet (ADS) has been filed on the filing date of this application, it is incorporated by reference herein. Any applications claimed on the ADS for priority under 35 U.S.C. § 119, 120, 121, or 365(c), and any and all parent, grandparent, great-grandparent, etc. applications of such applications, are also incorporated by reference, including any priority claims made in those applications and any material incorporated by reference, to the extent such subject matter is not inconsistent herewith.

BACKGROUND OF DISCLOSURE

1. Field of Invention

The present invention generally relates to an apparatus and method for providing a high thermally isolated environment.

2. Description of Prior Art

Numerous devices require a thermally isolated environment, stabilized and uniform temperature for low power consumption and high performance. Generally, heaters or coolers are implemented to actively maintain the temperature of a sample device. Thermal losses occur via convection by the surrounding fluid environment, radiation from the surfaces, and conduction through contact points, such as mechanical supports, signal inputs and outputs, and power lines. Reduction of power consumption in the heaters or coolers is generally achieved by reducing the number of contact points between the sample devices and the exterior environment, while reduction of thermal fluctuations due to environment temperature and its variation is generally achieved by a high thermal gain design. In practice, the air pressure around the sample device is reduced substantially to minimize convection, and a low emissivity coating is applied to the surfaces of the sample device to reduce thermal radiation; however, further reducing thermal losses due to conduction remains a challenge.

Systems for thermally isolated high performance devices are well known. U.S. Pat. No. 6,236,145 to Biernacki discloses a metal coated glass tubular wall with helical coils and having airgaps formed circumferentially around the wall. One end of the wall is supporting and electrically connected to a crystal resonator, and the other end of the wall is attaching and electrically connected to a substrate.

U.S. Pat. No. 7,215,213 to Mescher et al discloses a suspension of chip-scale device with a suspension frame defining a first plane and an opening through the frame. The device also has at least one tether that crosses the opening at an angle relative to the first plane.

U.S. Pat. No. 8,456,249 to DeNatale et al discloses a microscale rigidized polymer strap having a reinforcement structure extending from one side of the strap, a first substrate suspended by the strap, and a second substrate coupled to the strap to suspend the first substrate through the strap, wherein the strap is conformally coupled to the first substrate.

The invention presented herein overcomes several disadvantages of the prior art, such as lack of mechanical flexibility under vibration and shock, difficulty in maintaining a uniform temperature distribution for the sample device, and excessive power consumption in operating the apparatus. Furthermore, the invention is scalable for larger devices or increased number of inputs and output connections.

SUMMARY OF THE DISCLOSURE

The present invention provides an apparatus and method for supporting a mechanically stable and thermally isolated platform for operating sample devices which require extensive thermal isolation, such as quartz resonators, quartz oscillators, sensors including pressure sensors, infrared detectors, X-ray detectors, voltage references, accelerator meters, and quantum systems including atomic clocks, atomic gyroscopes, and atomic magnetometers. The present invention also provides methods for coupling the sample devices to the apparatus.

In a preferred embodiment, the apparatus comprises one or more microstructured tubes, a mounting base, and a substrate, wherein the substrate is supported by the microstructured tubes and coupled to a sample device requiring thermal isolation and precise temperature control. One or more of the microstructured tubes comprise a thermally resistive inner portion and a thin coated layer exhibiting low thermal emissivity and high electrical conductivity. An adherence layer may be incorporated between the inner portion and the thin coated layer to promote adhesion between these layers. The apparatus may further comprise a distributed heater, a lumped heater, or a wrapped around heater, as well as sustaining and control electronics coupled to the substrate. The apparatus may further comprise radiation reflectors for reflecting radiation in the infrared region of the electromagnetic spectrum and may further comprise a vacuum cover and getter material for maintaining a low pressure environment.

In an embodiment, the microstructured tubes are periodically aligned over the cross-sectional plane and are aligned substantially equal spaced parallel to a central axis and proximate to the mounting platform perimeter. In an embodiment, the sample device is attached to the top surface or the bottom surface of the substrate.

In an embodiment, the microstructured tubes are in a form of truss structure comprising slender two-force members joined together at end points and organized to behave as a single object, wherein the truss structure extends in one, two, or all x, y, and z directions of Cartesian coordinate, or in one, two, or all r, θ, and z directions of cylindrical coordinate, or in one, two, or all r, θ, and φ directions of spherical coordinate to improve resistance to compressive and tensile stresses, respectively.

Embodiments include one, more, or any combination of all of the features listed above. Other features and advantages of the present invention will become apparent from the following more detailed description, taken in conjunction with the accompanying, which illustrate, by way of example, the principles of the invention.

DESCRIPTION OF THE DRAWINGS

FIG. 3a is an elevated perspective view of a microstructured tube, in accordance with an exemplary embodiment of the present invention;

FIG. 3b is a top exploded view of the microstructured tube shown in FIG. 3a, in accordance with an exemplary embodiment of the present invention;

FIG. 4 is an elevated perspective view of a mounting support, a substrate, and a plurality of microstructured tubes, in accordance with an exemplary embodiment of the present invention.

Figure 1:
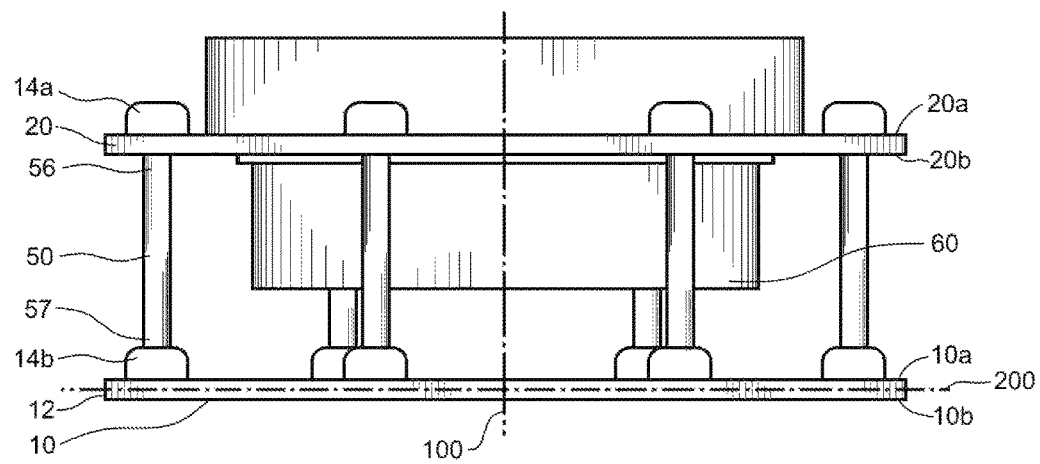
FIG. 1 is a side perspective view of a thermally isolated platform system, in accordance with an exemplary embodiment of the present invention.

REFERENCE NUMERALS IN THE DRAWINGS mounting base 10
mounting base top surface 10a
mounting base bottom surface 10b
substrate printed track 11a
mounting base printed track 11b
mounting base perimeter 12
substrate bonding 14a
mounting base bonding 14b
I/O transition 16
substrate 20
substrate top surface 20A
substrate bottom surface 20B
top radiation reflector mounting slot 22
sample device mounting hole 24
ventilation hole 26
heater 40
microstructured tube 50
tube inner portion 52
thin coated layer 55
upper end portion 56
lower end portion 57
adherence layer 59
sample device 60
bottom radiation reflector supporter 72
bottom radiation reflector 80
tube clearance port 81
middle radiation reflector 82
top radiation reflector 84
vacuum cover 86
getter 87
vacuum header 88
vacuum header I/O pins 89
sustaining electronics 90a
control electronics 90b
sample device connections 92
central axis 100
cross-sectional plane 200

DETAILED DESCRIPTION OF THE DISCLOSED EMBODIMENT

Illustrative embodiments of the invention are described below in the accompanying Figures. The following detailed description provides detailed schematics for a thorough understanding of and an enabling description for these embodiments. One having ordinary skill in the art will understand that the invention may be practiced without certain details. In other instances, well-known structures and functions have not been shown or described in detail to avoid unnecessarily obscuring the description of the embodiments.

Figure 2:
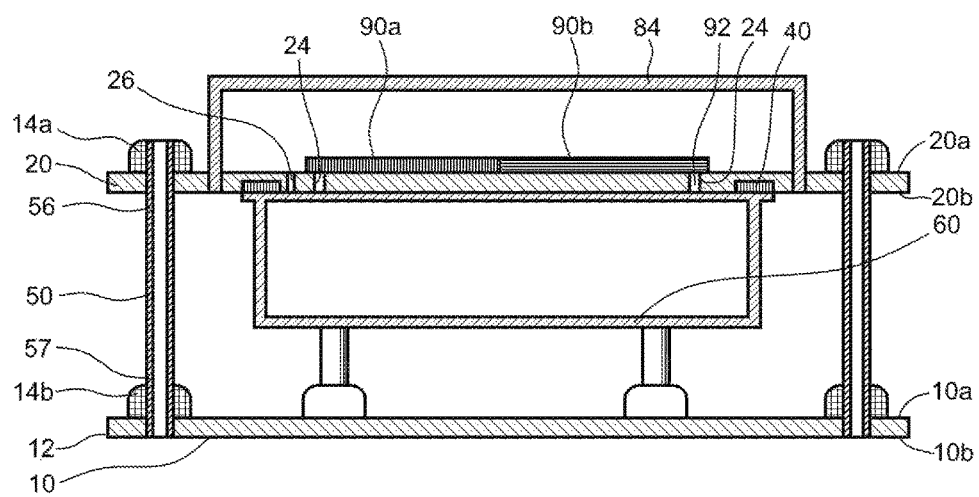
FIG. 2 is a side cutaway view of the thermally isolated platform system in FIG. 1, in accordance with an exemplary embodiment of the present invention.

FIG. 1 is a side perspective view of a thermally isolated platform system, in accordance with an exemplary embodiment of the present invention. FIG. 2 is a side cutaway view of the thermally isolated platform system in FIG. 1, in accordance with an exemplary embodiment of the present invention. The system comprises a mounting base 10 having a mounting base top surface 10a and a mounting base bottom surface 10b, a substrate 20 having a substrate top surface 20a and a substrate bottom surface 20b and supported to the mounting base 10 by one or more microstructured tubes 50, and a sample device 60 mounted directly to the substrate 20, wherein the sample device 60 requires high thermal isolation and precise temperature control. In this example embodiment, the mounting base 10 and the substrate 20 are disk shaped and of similar size and are oriented substantially parallel with each other; however, it is contemplated that particular applications may benefit from other relative orientations, shapes, and sizes of the mounting base 10 and substrate 20. The system may further comprise sustaining electronics 90a and control electronics 90b, wherein the sustaining electronics 90a convert information in the sample device 60 to electrical signal, are sensitive to temperature change, and may be integrated into the substrate 20, while the control electronics 90b regulate the temperature of the sample device 60 and may be installed either on substrate 20 or on the mounting base top surface 10a. The sustaining and control electronics 90a and 90b may be combined with or separated from the sample device 60, wherein when separated, both sustaining and control electronics 90a and 90b and sample device 60 may be attached to either the bottom surface 20b or the top surface 20a of the substrate 20. The system may further comprise a top radiation reflector 84 for reflecting radiation in the infrared region of electromagnetic radiation and for covering the sustaining and control electronics 90a and 90b, wherein the top radiation reflector 84 is generally mounted to the substrate 20 via a plurality of top radiation reflector mounting slots 22. The substrate 20 may further comprise sample device mounting holes 24 for securing the sample device 60 to the substrate 20 and for housing sample device connections 92 that provide electrical connection between the sample device 60 and the sustaining and control electronics 90a and 90b. One or more ventilation holes 26 may be drilled on the substrate 20 for removing air trapped between the sample device 60 and the substrate 20.

FIG. 3a is an elevated perspective view of a microstructured tube 50, in accordance with an exemplary embodiment of the present invention. FIG. 3b is a top exploded view of the microstructured tube 50 shown in FIG. 3a, in accordance with an exemplary embodiment of the present invention. The microstructured tubes 50 have a tube inner portion 52, an upper end portion 56, a lower end portion 57, and a thin coated layer 55 substantially thinner than the tube inner portion 52 and comprising an electrically conductive material that exhibits substantially low thermal emissivity, wherein the tubes 50 are designed to exhibit a high mechanical strength with respect to both tension and compression. Additionally, the tubes 50 have a hollow or vacant interior, are uncapped, and are designed to have small cross-sectional areas for reducing thermal conduction between the substrate 20 and the mounting base 10 within the desired temperature range. The securing of upper end portions 56 to the substrate 20 and the lower end portions 57 to the mounting base 10 may be accomplished by mechanical friction, by use of substrate bonding 14a and mounting base bonding 14b, respectively, by an electrically conductive adhesive, or by solder. The thin coated layer 55 is preferably polished and may comprise gold, aluminum, silver, platinum, palladium, copper, nickel, titanium, chromium, ruthenium, or any combination thereof.

The cross-sectional form of the microstructured tubes 50 may be elliptical, polygonal, multipoint star shaped, or combinations thereof, depending on the mechanical stability necessary for the sample device to operate.

In some embodiments, the sample device 60 may be attached to the top side or the bottom side of the substrate 20 to reduce the overall height of the apparatus.

In an embodiment, the microstructured tubes 50 are aligned symmetrically about and parallel to the central axis 100. In an embodiment, the tubes 50 are aligned parallel to the central axis 100 and also one or more directions orthogonal to the central axis 100 and conjoining at intersections. In an embodiment, one or more tubes 50 are tensioned to resist compressive stresses. In an embodiment, one or more tubes 50 are compressed to resist tensile stresses. In an embodiment, the microstructured tubes 50 are arranged in the form of truss structure comprising slender two-force members joined together at end points and organized to behave as a single object, wherein the truss structure extends in one, two, or all three directions of Cartesian coordinates, cylindrical coordinates, or spherical coordinates to further improve resistance to compressive and tensile stresses.

Materials suitable for the inner portions 52 of the microstructured tubes 50 exhibit substantial thermal resistivity and may include, but are not limited to, silica glass, other ceramics exhibiting a low thermal conductivity, polymers exhibiting a lower thermal conductivity, such as polyimides, poly(amides), poly(ethylene), poly(tetrafluoroethylene) and other fluorinated polymers, B-staged bisbenzocyclobutene-based polymers, poly(paraxylylene) based polymers, epoxy-based photoresist formulated in gamma-butyrolactone, epoxy-based photoresist formulated in cyclopentanone, polystyrenes, polycarbonates, poly(propylene), poly(methyl methacrylate), poly(vinylidene fluoride), and lyotropic liquid-crystal polymers.

In an embodiment, the microstructured tubes 50 are periodically aligned substantially equally spaced about the cross-sectional plane 200 and proximate to the mounting base perimeter 12. The tubes 50 may be also be aligned as a cladding surrounding one or more tube end portions 56 or 57, wherein the tube end portions 56 and 57 are aligned parallel with the central axis 100.

FIG. 4 is an elevated perspective view of a mounting base 10, a substrate 20, and a plurality of microstructured tubes 50, in accordance with an exemplary embodiment of the present invention. The sample device 60 is heated on the substrate 20 by a heater 40 positioned proximate to the sample device 60. The heater 40 may be a distributed heater embedded into the substrate 20, a lumped heater installed on the substrate 20 or a heater wrapped around the sample device 60, to provide a substantially uniform temperature for the device 60. The mounting base 10 comprises one or more I/O transitions 16, or connection terminal ports, for electrically connecting with vacuum header I/O pins 89 positioned on a vacuum header 88. Electrical connection between the tubes 50 and the I/O transitions 16 generally occurs via mounting base printed track 11b or generally any material used in the thin coated layer 55. Similarly, electrical connection between the tubes 50 and the heater 40 and sustaining and control electronics 90a and 90b also generally occurs via substrate printed track 11a or any material used in the thin coated layer 55.

In an example embodiment, the substrate 20 and the mounting base 10 are dielectric substrates that are manufactured of materials or structures exhibiting high thermal conductivity, such as aluminum nitride, beryllium oxide, alumina, silicon carbide, quartz, diamond, sapphire, hexagonal boron nitride, graphene, graphene nanoribbons, or a metal core printed circuit board. The inner portions 52 of the microstructured tubes 50 comprise silica glass cladded with polyimide, and the thin coated layer 55 is an ultra-thin layer of a metal, such as gold for providing a low thermal emissivity surface with a high electrical conductivity. An ultra-thin adherence layer of a second material, such as titanium, nickel, molybdenum, tungsten, or combinations thereof, may be coated in between the outer gold layer and polyimide to promote adhesion between the thin coated layer 55 and the inner portion 52. A high performance device 60, such as a quartz resonator, may be coupled to the substrate 20 through a collection of patterned printed electrical wires coated onto the substrate 20 and in electrical connection with both the sample device 60 and the thin coated layer 55 of the microstructured tubes 50.

In various embodiments, the apparatus is designed to stably support and precisely control the temperature of a quartz resonator with sufficient sample device connections 92, thereby enabling fabrication of mechanically stable quartz oscillator systems with reduced power consumption relative to conventional ovenized quartz oscillators exhibiting a similar frequency reference accuracy.

In an embodiment, the apparatus comprises a top radiation reflector 84 for the substrate 20, the heater 40, and the sustaining and control electronics 90a and 90b. The top radiation reflector 84 may comprise an organic polymer with substantially low out gassing or one or more materials that the thin coated layer 55 of the microstructured tubes 50 comprise.

Figure 5:
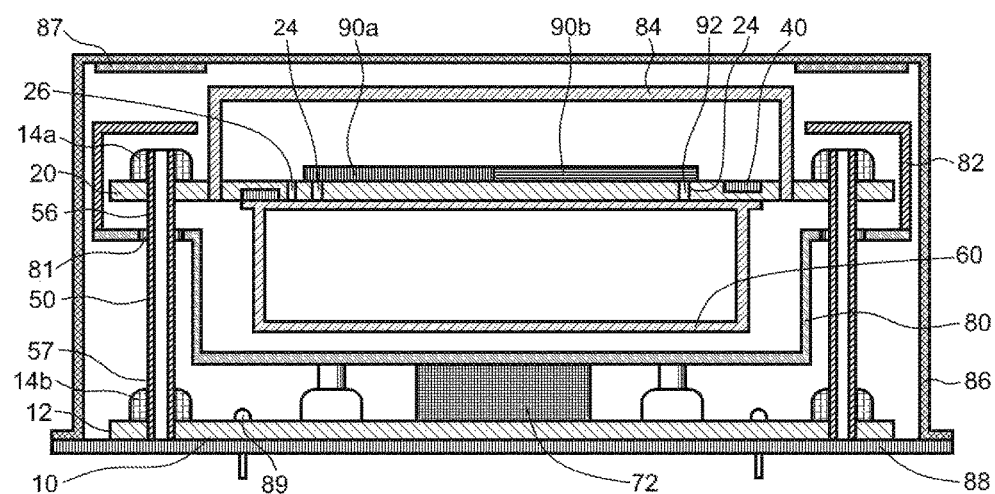
FIG. 5 is a side perspective view of a vacuum capable thermally isolated platform system, in accordance with an exemplary embodiment of the present invention.

FIG. 5 is a side perspective view of a vacuum capable thermally isolated platform system, in accordance with an exemplary embodiment of the present invention. In order to reduce thermal loss by convection, the thermally isolated system seals in vacuum environment and keeps a vacuum level of less than 0.133 pascals [1 millitorr] by selecting materials with substantially low outgassing, by following a vacuum cleaning process, and by inserting getter material 87 inside the vacuum package. In this example embodiment, the apparatus further comprises a bottom radiation reflector 80, a middle radiation reflector 82, a top radiation reflector 84, a vacuum cover 86, and a vacuum header 88 comprising one or more vacuum header I/O pins 89. The radiation reflectors 80, 82, and 84 reflect radiation in the infrared region of the electromagnetic spectrum. The bottom radiation reflector 80 extends radially from the central axis 100 between the sample device 60 and the mounting base 10, then extends towards the substrate 20 before further extending radially and terminating just beyond the diameter of the substrate 20. The bottom radiation reflector 80 further comprises tube clearance ports 81 that are larger than the diameter of the microstructured tubes 50 so as to leave gaps between the tubes 50 and the bottom radiation reflector 80 upon assembly of the apparatus. The middle radiation reflector 82 extends radially from positions adjacent to but not contacting the top radiation reflector 84 then terminates at the bottom radiation reflector 80. The vacuum cover 86 encases the thermally isolated platform system and seals with the vacuum header 88 adjacent to the mounting base perimeter 12 by cold welding, resistance welding, or soldering. Low pressures for the system are generally accomplished by selecting materials with substantially low outgassing, by following a vacuum cleaning process, and by directly attaching getter material 87 to the interior of the vacuum cover 86. The getter 87 further lowers the pressure inside the vacuum cover 86 and generally takes the form of a flat ring or a disk welded on the top interior side of the vacuum cover 86 or directly coated onto the inner side walls of the vacuum cover 86. The performance of the system may be further improved by incorporating a bottom radiation reflector supporter 72 positioned between and directly adhering to the mounting base 10 and the bottom radiation reflector 80. The radiation reflector supporter 72 is substantially centered about the central axis 100 and comprises a material exhibiting partial elasticity, which may include but is not limited to, polymers exhibiting substantially low outgassing.

In an embodiment, the thermally isolated platform system is further integrated into a second temperature control package or temperature controlled environment for fabricating ultra-low power double oven devices, such as double oven quartz resonators, quartz oscillators, sensors, and atomic systems.

In an example apparatus with an overall approximate height of 1 to 2 centimeters and a diameter of 2 to 4 centimeters, the thickness of the inner portions 54 of the microstructured tubes 50 ranges from 0.05 micrometers to 2 millimeters, the thickness of the thin coated layer 55 ranges from 50 to 150 nanometers, and the thickness of the adherence layer 59 ranges from 2.5 to 40 nanometers. The example apparatus utilizes a 60 milliwatt control electrical power to securely support a quartz oscillator at a substantially uniform operating temperature of 95 degrees Celsius in an ambient environment with an approximate temperature of 25 degrees Celsius.

While the above described embodiments of the invention is applied generally to devices such as an ovenized quartz resonators, quartz oscillators, sensors, and quantum systems, the embodiments may also be applied to other types of devices that require high thermal insulation and/or precise temperature control for operation, which include, but are not limited to atomic clocks, atomic gyroscopes, atomic magnetometers, infrared detectors, X-ray detectors, pressure sensors, voltage reference, accelerator meters, charge amplifiers, various optoelectronic devices, and other experimental or analytical instruments or apparatuses.

While particular embodiments of the invention have been described and disclosed in the present application, it is clear that any number of permutations, modifications, or embodiments may be made without departing from the spirit and the scope of this invention. Accordingly, it is not the inventor's intention to limit this invention in this application, except as by the claims.

Particular terminology used when describing certain features or aspects of the invention should not be taken to imply that the terminology is being redefined herein to be restricted to any specific characteristics, features, or aspects of the invention with which that terminology is associated. In general, the terms used in the claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention.

The above detailed description of the embodiments of the invention is not intended to be exhaustive or to limit the invention to the precise embodiment or form disclosed herein or to the particular field of usage mentioned in this disclosure. While specific embodiments of, and examples for, the invention are described above for illustrative purposes, various equivalent modifications are possible within the scope of the invention, as those skilled in the relevant art will recognize. Also, the teachings of the invention provided herein can be applied to other systems, not necessarily the system described above. The elements and acts of the various embodiments described above can be combined to provide further embodiments.

All of the above patents and applications and other references, including any that may be listed in accompanying filing papers, are incorporated herein by reference. Aspects of the invention can be modified, if necessary, to employ the systems, functions, and concepts of the various references described above to provide yet further embodiments of the invention.

In general, the terms used in the claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention under the claims.

In light of the above "Detailed Description," Inventor may make changes to the invention. While the detailed description outlines possible embodiments of the invention and discloses the best mode contemplated, no matter how detailed the above appears in text, the invention may be practiced in a myriad of ways. Thus, implementation details may vary considerably while still being encompassed by the spirit of the invention as disclosed by the inventor. As discussed herein, specific terminology used when describing certain features or aspects of the invention should not be taken to imply that the terminology is being redefined herein to be restricted to any specific characteristics, features, or aspects of the invention with which that terminology is associated.

What is claimed is:

1. A mechanically stable and thermally isolated platform comprising:
   a mounting base comprising a mounting base top surface and a mounting base bottom surface, wherein said mounting base extends from a central axis along a cross-sectional plane terminating at a mounting base perimeter;
   a substrate comprising a substrate top surface and a substrate bottom surface;
   one or more microstructured tubes for supporting said substrate, each said microstructured tube comprising a tube inner portion, a thin coated layer, an upper end portion, and a lower end portion and directly attaching to said mounting support at said lower end portion and directly attaching to said substrate at said upper end portion, wherein one or more said tube inner portions comprise a thermal resistive material, wherein one or more said thin coated layers exhibit substantially low thermal emissivity and substantially high electrical conductivity; and
   a sample device mounted to said substrate top surface or said substrate bottom surface.

2. The mechanically stable and thermally isolated platform of claim 1, wherein said one or more microstructured tubes are aligned substantially parallel to the central axis and positioned periodically and substantially equal spaced about said first cross-sectional plane and adjacent to said mounting base perimeter.

3. The mechanically stable and thermally isolated platform of claim 1, wherein one or more of said microstructured tubes are tensioned for resisting compressive stresses or compressed for resisting tensile stresses.

4. The mechanically stable and thermal isolation platform of claim 1, wherein said thin coated layer is selected from the group consisting of gold, aluminum, silver, platinum, palladium, copper, nickel, titanium, chromium, ruthenium, and any combination thereof.

5. The mechanically stable and thermal isolation platform of claim 1, wherein said thermal resistive material comprises a material selected from the group consisting of silica glass, other ceramics exhibiting a low thermal conductivity, polyimides, poly(amides), poly(ethylene), poly(tetrafluoroethylene) and other fluorinated polymers, B-staged bisbenzocyclobutene-based polymers, poly(paraxylylene) based polymers, epoxy-based photoresist formulated in gamma-butyrolactone, epoxy-based photoresist formulated in cyclopentanone, polystyrenes, polycarbonates, poly(propylene), poly(methyl methacrylate), poly(vinylidene fluoride), and lyotropic liquid-crystal polymers.

6. The mechanically stable and thermally isolated platform of claim 1, wherein one or more said microstructured tubes further comprises an adherence layer for promoting adhesion between said thin coated layer and said inner portion.

7. The mechanically stable and thermally isolated platform of claim 6, wherein said adherence layer comprises a material selected from the group consisting of titanium, nickel, molybdenum, and tungsten.

8. The mechanically stable and thermally isolated platform of claim 1, further comprising a heater for providing a substantially uniform heat flux to said sample device, wherein said heater directly contacts said substrate in proximity to said sample device.

9. The mechanically stable and thermally isolated platform of claim 8, wherein said substrate, said sample device, or said heater further comprises a top radiation reflector, a middle radiation reflector, or a bottom radiation reflector for reflecting infrared electromagnetic radiation.

10. The mechanically stable and thermally isolated platform of claim 8, wherein said heater is a distributed heater, a lumped heater, or a wrapped around heater.

11. The mechanically stable and thermally isolated platform of claim 1, wherein said sample device is selected from the group consisting of a quartz resonator, a quartz oscillator, a sensor, a quantum system, an atomic clock, an atomic gyroscope, an atomic magnetometers, an infrared detector, an X-ray detector, a pressure sensor, a voltage reference, an accelerator meter, a charge amplifier, and an optoelectronic device.

12. The mechanically stable and thermally isolated platform of claim 1, further comprising sustaining electronics or control electronics, wherein said sustaining electronics convert information of said sample device to electrical signal and are integrated into said sample device, or coupled directly to said substrate, or integrated into said mounting base, wherein said control electronics regulate temperature of said sample device and are integrated into said substrate or said mounting base.

13. The mechanically stable and thermally isolated platform of claim 1, wherein said substrate further comprises one or more ventilation holes for removing air trapped between said sample device and said substrate.

14. The mechanically stable and thermally isolated platform of claim 1, further integrated into a second temperature control package for forming double oven devices.

15. The mechanically stable and thermally isolated platform of claim 1, wherein said substrate or said mounting base comprises a material selected from the group consisting of aluminum nitride, beryllium oxide, alumina, silicon carbide, quartz, diamond, sapphire, hexagonal boron nitride, graphene, graphene nanoribbons, a metal core printed circuit board and dielectric materials.

16. The mechanically stable and thermally isolated platform of claim 12, wherein said sustaining electronics or said control electronics further comprise a top radiation reflector, wherein said top radiation reflector is mounted into said substrate at one or more top radiation reflector mounting slots.

17. The mechanically stable and thermally isolated platform of claim 1, wherein said substrate further comprises one or more sample device mounting holes, wherein each said sample device mounting hole mounts one or more input or output connections for providing electrical connection between said substrate and said sample device through said sample device mounting holes.

18. The mechanically stable and thermally isolated platform of claim 1, further comprising a vacuum cover welded or soldered to a vacuum header for providing a low pressure environment, and further comprising a vacuum getter directly attached to said vacuum cover.

19. A mechanically stable and vacuum capable thermally isolated platform comprising:
   a mounting base comprising a mounting base top surface and a mounting base bottom surface, wherein said mounting base extends from a central axis along a cross-sectional plane terminating at a mounting base perimeter;

a substrate comprising a substrate top surface and a substrate bottom surface;

one or more microstructured tubes for supporting said substrate, each said microstructured tube comprising a tube inner portion, a thin coated layer, an upper end portion, and a lower end portion and directly attaching to said mounting support at said lower end portion and directly attaching to said substrate at said upper end portion, wherein one or more said tube inner portions comprise a thermal resistive material, wherein one or more said thin coated layers exhibit substantially low thermal emissivity and substantially high electrical conductivity;

a sample device mounted to said upper surface or said lower surface of said substrate;

a top radiation reflector;

a bottom radiation reflector extending radially from said central axis between said sample device and said mounting base, then extending towards said substrate, then extending radially and terminating beyond said substrate, wherein said bottom radiation reflector comprises one or more tube clearance ports, wherein each said tube clearance port is larger than said thin coated layer;

a middle radiation reflector extending radially from positions adjacent to but not contacting said top radiation reflector and terminating at said bottom radiation reflector; and a vacuum cover sealed to said vacuum header adjacent to said mounting base perimeter and encasing said mounting base, said substrate, said one or more microstructured tubes, said sample device, said top radiation reflector, said bottom radiation reflector, and said middle radiation reflector.

20. A method for thermally isolating a sample device, said method comprising the step of:

electrically connecting said sample device to one or more header pins through a substrate comprising a dielectric material, one or more microstructured tubes, and a mounting base, wherein said sample device is soldered or adhered to a first surface of said substrate, wherein said header pins are positioned on a vacuum header, wherein said microstructured tubes each comprising a tube inner portion, and a thin coated layer, wherein each said tube inner portion comprises a thermal resistive layer, and wherein each said thin coated layer exhibits substantially high electrical conductivity and substantially low thermal emissivity.

\* \* \* \* \*